(12) United States Patent
White

(10) Patent No.: US 11,343,944 B2
(45) Date of Patent: May 24, 2022

(54) DEEP-WATER SUBMERSIBLE SYSTEM

(71) Applicant: Raytheon Company, Waltham, MA (US)

(72) Inventor: Brian M. White, Bristol, RI (US)

(73) Assignee: Raytheon Company, Waltham, MA (US)

( * ) Notice: Subject to any disclaimer, the term of this patent is extended or adjusted under 35 U.S.C. 154(b) by 792 days.

(21) Appl. No.: 15/829,692

(22) Filed: Dec. 1, 2017

(65) Prior Publication Data

US 2019/0168853 A1 Jun. 6, 2019

(51) Int. Cl.
*B63B 1/14* (2006.01)
*H05K 7/20* (2006.01)
(Continued)

(52) U.S. Cl.
CPC .......... *H05K 7/20445* (2013.01); *B63B 1/14* (2013.01); *B63G 8/001* (2013.01); *B63G 8/41* (2013.01);
(Continued)

(58) Field of Classification Search
CPC .. H05K 7/1404; H05K 7/1442; H05K 7/1427; H05K 7/2049; H05K 5/068;
(Continued)

(56) References Cited

U.S. PATENT DOCUMENTS 4,360,290 A * 11/1982 Ward .................. E21B 43/0107
138/89
5,168,933 A * 12/1992 Pritchard, Jr. ........ E21B 33/043
166/212
(Continued)

FOREIGN PATENT DOCUMENTS

FR 2977448 A1 1/2013

OTHER PUBLICATIONS

International Search Report for International Application No. PCT/US20 U.S. Appl. No. 18/062,906 dated Jun. 19, 2019, 21 pages.
(Continued)

*Primary Examiner* — Mark A Williams

(57) ABSTRACT

A deep-water submersible system is disclosed. The system can include a pressure vessel and an internal assembly. The internal assembly can include a housing and a wedge lock assembly coupleable to the housing. The wedge lock assembly can include a plurality of wedge members arranged along a longitudinal axis and including end wedge members at each end and one or more intermediate wedge members between the end wedge members. The wedge lock assembly can also include a displacement device along the longitudinal axis and connecting the end wedge members. The displacement device can be actuatable in one direction to move the end wedge members toward one another to displace adjacent wedge members relative to one another in a direction transverse to the longitudinal axis to engage and apply a clamping force to the housing and the pressure vessel. In addition, the wedge lock assembly can include a variable gap compensation mechanism operable to exert a biasing force on the plurality of wedge members to accommodate the relative transverse movement of the adjacent wedge members and maintain the clamping force on the housing and the pressure vessel within a predetermined range as a distance between the housing and the pressure vessel varies.

31 Claims, 5 Drawing Sheets

(51) Int. Cl.
    *H05K 7/14*    (2006.01)
    *B63G 8/00*    (2006.01)
    *B63G 8/41*    (2006.01)

(52) U.S. Cl.
    CPC ......... *H05K 7/1404* (2013.01); *H05K 7/1434* (2013.01); *B63B 2241/24* (2013.01); *B63G 2008/004* (2013.01)

(58) Field of Classification Search
    CPC .... H05K 5/069; H05K 7/1407; H05K 7/1434; H05K 7/20445; F16B 2/14; F16B 2/065; F16B 2/04; Y10T 403/76; Y10T 403/7069; Y10T 403/7064; Y10T 403/7067; B63G 8/001; B63G 8/41; B63G 2008/004; F05B 2240/14; F05B 2240/97; F16L 3/04; B63B 8/14; B63B 7/04; B63B 2241/24
    See application file for complete search history.

(56) References Cited

U.S. PATENT DOCUMENTS

| | | | |
|---|---|---|---|
| 6,394,019 B1 | 5/2002 | West | |
| 6,647,913 B2 | 11/2003 | Brignolio | |
| 6,763,774 B1 | 7/2004 | Ranieri et al. | |
| 8,256,538 B1* | 9/2012 | Deslierres | E21B 34/04 175/235 |
| 8,733,267 B2* | 5/2014 | Chen | B63G 8/14 114/331 |
| 9,045,195 B2 | 6/2015 | Poppell | |
| 2003/0048049 A1* | 3/2003 | Seal | F16B 2/14 312/294 |
| 2003/0048618 A1* | 3/2003 | Adams, Sr. | H05K 7/20445 361/740 |
| 2011/0150568 A1 | 6/2011 | Deisenhofer | |
| 2012/0314373 A1* | 12/2012 | Park | H05K 7/1434 361/715 |
| 2016/0338215 A1 | 11/2016 | Paykarimah | |
| 2018/0038193 A1* | 2/2018 | Walton | E21B 33/134 |
| 2018/0355679 A1* | 12/2018 | Gruber | F16L 3/04 |
| 2019/0168853 A1* | 6/2019 | White | H05K 7/1404 |
| 2020/0189705 A1* | 6/2020 | Meyer | F42B 19/04 |

OTHER PUBLICATIONS

Invitation to Pay Additional Fees for International Application No. PCT/US2018/062906 dated Feb. 21, 2019, 13 pages.

* cited by examiner

DEEP-WATER SUBMERSIBLE SYSTEM

BACKGROUND

Deep-water submersible systems exist for a variety of applications. One type of deep-water submersible system includes electronic components that may be deposited on a sea-floor for power and/or communication lines. The electronic components are protected from the underwater environment by an outer structural enclosure, such as a pressure vessel. Electronic components may generate significant heat that needs to be removed to maintain performance and longevity of the electronic components. Such deep-water submersible systems are often designed to remove heat from the internal electronic components via conduction through the outer structural enclosure.

BRIEF SUMMARY OF THE INVENTION

An initial overview of the inventive concepts is provided below and then specific examples are described in further detail later. This initial summary is intended to aid readers in understanding the examples more quickly, but is not intended to identify key features or essential features of the examples, nor is it intended to limit the scope of the claimed subject matter.

Although deep-water submersible systems housing electronic components have been successfully deployed for long-term use in underwater environments, these systems do have certain shortcomings. For instance, outer structural enclosures that house the electronic components deform under the water pressures that exist at typical service depths. Such deformation can subject internal structures, such as the electronic components and internal support structures for the electronic components, to potentially damaging loading conditions. In addition, deformation of the outer structural enclosures can negatively impact cooling of the electronic components by disrupting thermal cooling paths designed to transfer heat via the outer structural enclosures.

Accordingly, a deep-water submersible system is disclosed that accommodates deformation of an outer structural enclosure, such as a pressure vessel, to maintain acceptable loading on internal components. In one aspect, the integrity of thermal cooling paths can be maintained. The deep-water submersible system can include a pressure vessel and an internal assembly. The internal assembly can include a housing and a wedge lock assembly coupleable to the housing. The wedge lock assembly can include a plurality of wedge members arranged along a longitudinal axis and including end wedge members at each end and one or more intermediate wedge members between the end wedge members. The wedge lock assembly can also include a displacement device along the longitudinal axis and connecting the end wedge members. The displacement device can be actuatable in one direction to move the end wedge members toward one another to displace adjacent wedge members relative to one another in a direction transverse to the longitudinal axis to engage and apply a clamping force to the housing and the pressure vessel. In addition, the wedge lock assembly can include a variable gap compensation mechanism operable to exert a biasing force on the plurality of wedge members to accommodate the relative transverse movement of the adjacent wedge members and maintain the clamping force on the housing and the pressure vessel within a predetermined range as a distance between the housing and the pressure vessel varies.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

Figure 1:
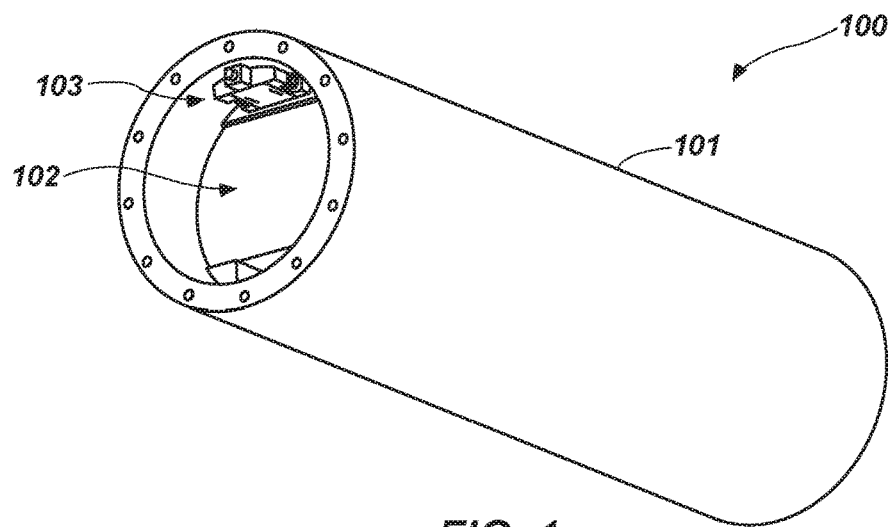
FIG. 1 is an illustration of a deep-water submersible system in accordance with an example of the present disclosure.

To further describe the present technology, examples are now provided with reference to the figures. With reference to FIG. 1, one embodiment of a deep-water submersible system 100 is illustrated. The system 100 can comprise a pressure vessel 101 and an internal assembly 102. A portion of the pressure vessel 101 has been omitted to reveal the internal assembly 102. In some embodiments, the pressure vessel 101 can have a cylindrical configuration that forms a structural enclosure for the internal assembly 102. As described in more detail below, the internal assembly 102 can be secured to the pressure vessel 101 by application of a clamping or locking force, which can be provided by a suitable clamp or locking mechanism, such as a wedge lock assembly 103. Although the present technology is presented in the context of a deep-water submersible system, it should be recognized that aspects of the present technology may be applicable to any system where two components are secured to one another by application of a clamping or locking force.

Figure 2:
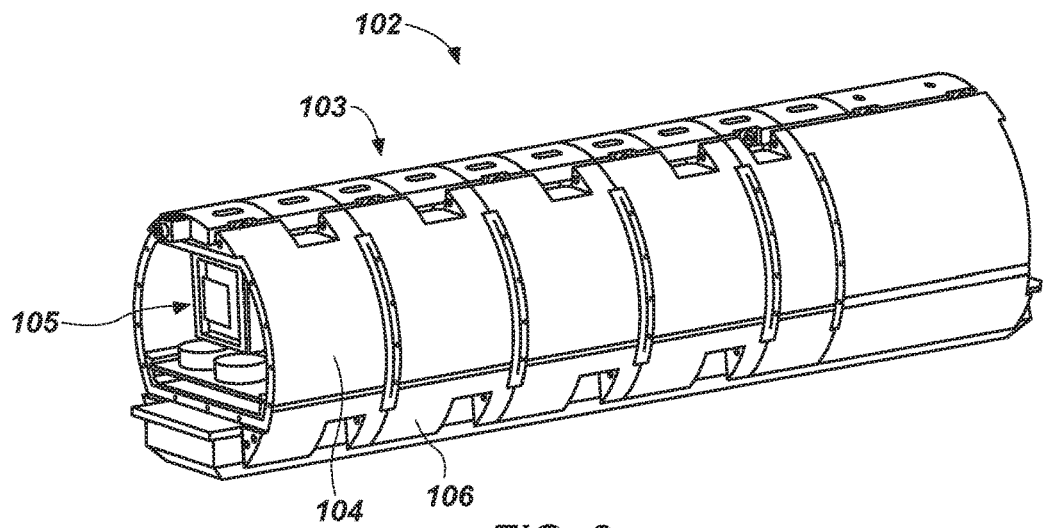
FIG. 2 is an illustration of an inner assembly of the deep-water submersible system of FIG. 1, in accordance with an example of the present disclosure.

With continued reference to FIG. 1, FIG. 2 is referenced and shows the internal assembly 102 isolated from the pressure vessel 101. The internal assembly 102 can include a housing 104, which can be configured to support an internal component 105, such as an electronic component. The internal assembly 102 can also include the wedge lock assembly 103, which can be coupleable to the housing 104 to secure the housing 104 to the pressure vessel 101. Alternatively, a wedge lock assembly can be coupled to or otherwise associated with a pressure vessel, or independent of the internal assembly and pressure vessel.

Figure 3:
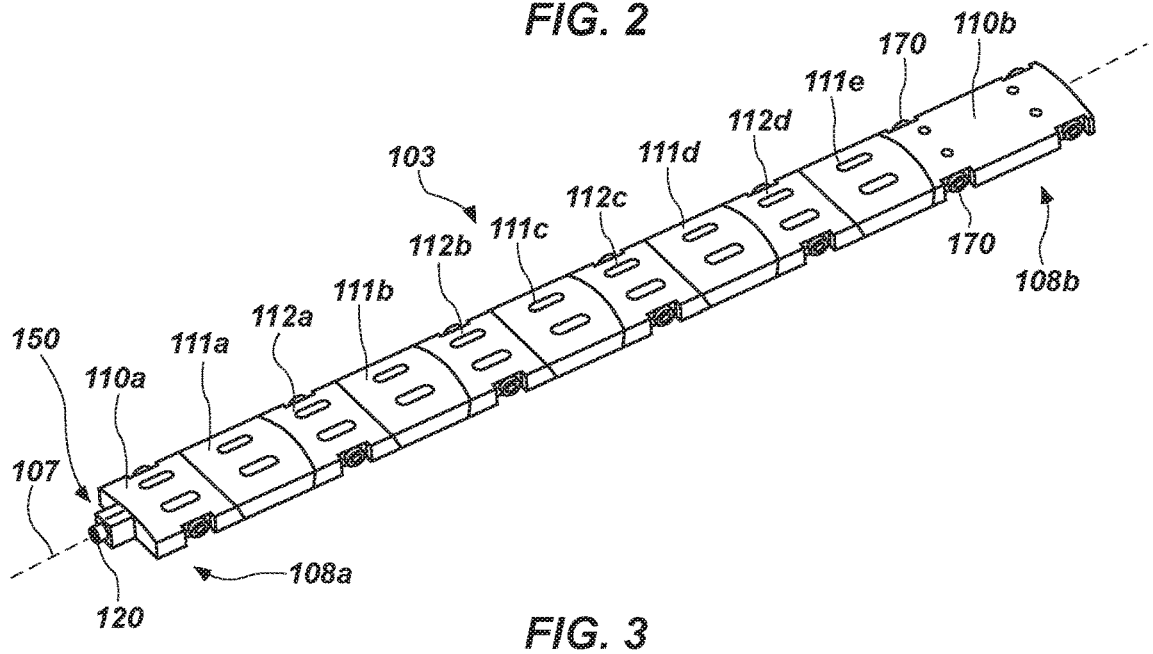
FIG. 3 is an illustration of wedge lock assembly of the deep-water submersible system of FIG. 1, in accordance with an example of the present disclosure.

With continued reference to FIGS. 1 and 2, FIG. 3 is referenced and shows the wedge lock assembly 103 isolated from the housing 104. The wedge lock assembly 103 can include a plurality of wedge members arranged along a longitudinal axis 107. For example, the wedge lock assembly 103 can include end wedge members 110a, 110b at each end 108a, 108b, and one or more intermediate wedge members 111a-e, 112a-d between the end wedge members 110a, 110b. The wedge lock assembly 103 can also include a displacement device 120 supported and extending along, parallel to or coaxial with, the longitudinal axis 107 and connecting the end wedge members 110a, 110b. The displacement device 120 can be actuatable in one direction to move the end wedge members 110a, 110b toward one another to displace adjacent wedge members relative to one another in a direction transverse to the longitudinal axis 107 to engage and apply a clamping force to the housing 104 and the pressure vessel 101. The displacement device 120 can be coupled to the end wedge members 110a, 110b in any suitable manner, such as a connection that facilitates relative movement (e.g., a threaded engagement) or a fixed connection (e.g., welded, pinned, clamped, glued, etc.). Any suitable displacement device can be utilized, such as a screw, a lever-actuated cam operable with a shaft or rod extending between and connecting the end wedge members 110a, 110b, etc. In the illustrated embodiment, the displacement device comprises a screw, but this is not meant to be limiting in any way. In one aspect, the screw 120 can be engaged or coupled to the end wedge member 110b via a threaded interface feature (hidden from view) of the end wedge member 110b. Thus, the screw 120 can extend from the end wedge member 110a through or past the intermediate wedge members 111a-e, 112a-d to the end wedge member 110b, where the screw 120 can threadingly engage the end wedge member 110b. The wedge members can be configured such that upon tightening the screw 120, the intermediate wedge members 111a-e move laterally outward or away from the housing 104 to engage and interface with the pressure vessel 101. In one embodiment, a shaft or rod can be movably or fixedly coupled to the end wedge member 110b, and a lever-actuated cam can be associated with an opposite end of the shaft or rod proximate the end wedge member 110a to move the end wedge members 110a, 110b toward one another.

The housing 104 can have one or more contact pads 106. The wedge lock assembly 103 and the contact pads 106 can be configured to interface with the pressure vessel 101. For example, the wedge lock assembly 103 and the contact pads 106 can be configured to interface one or more internal surfaces of the pressure vessel 101. In the illustrated embodiment, the wedge lock assembly 103 can have curved interface surfaces configured to match the curved internal surface of the pressure vessel 101. In one aspect, the wedge lock assembly 103 and two contact pads 106 can be located about a circumference of the housing 104 to provide "three point" contact of the internal assembly 102 with the pressure vessel 101. For example, the wedge lock assembly 103 and two contact pads 106 can be equally spaced from one another (i.e., 120 degrees apart) about the circumference of the housing 104.

Figure 4:
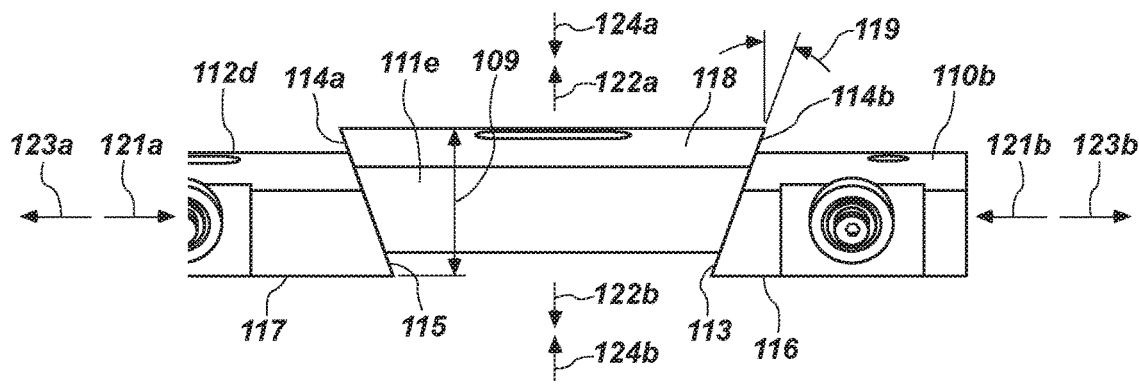
FIG. 4 is a detail side view of wedge members of the wedge lock assembly of FIG. 3.

With continued reference to FIGS. 1-3, FIG. 4 is referenced and illustrates a detail view of the end wedge member 110b and intermediate wedge members 111e, 112d. The aspects of the end wedge member 110b and intermediate wedge members 111e, 112d discussed with respect to FIG. 4 may serve as an example that may be applicable to the other end and intermediate wedge members. Each wedge member can have at least one wedge surface configured to engage a wedge surface of an adjacent wedge member. For example, each end wedge member 110a, 110b can have a wedge surface, and each intermediate wedge member 111a-e, 112a-d can have wedge surfaces at opposite ends. As shown in the figure, the end wedge member 110b can have a wedge surface 113. The intermediate wedge member 111e can have wedge surfaces 114a, 114b at opposite ends. The intermediate wedge member 112d can also have wedge surfaces at opposite ends, but only wedge surface 115 is shown in FIG. 4. The wedge surfaces of adjacent wedge members can engage one another. Thus, for example, in FIG. 4 the wedge surfaces 113, 114b of respective adjacent wedge members 110b, 111e engage one another, and the wedge surfaces 114a, 115 of respective adjacent wedge members 111e, 112d engage one another.

Causing the end wedge members 110a, 110b to move toward one another by actuating the displacement device (e.g., by rotating the screw 120 in one direction) can displace adjacent wedge members relative to one another to engage and apply a clamping force to the housing 104 and the pressure vessel 101. On the other hand, facilitating movement of the end wedge members 110a, 110b away from one another (e.g., by rotating the screw 120 in an opposite direction) can enable displacement of adjacent wedge members relative to one another sufficient to disengage the pressure vessel 101 and/or the housing 104. For example, causing the end wedge members 110a, 110b to move toward one another can result in relative movement of each adjacent pair of wedge members toward one another in directions 121a, 121b parallel to the longitudinal axis 107. Due to the interfacing wedge surfaces of the adjacent wedge members, such longitudinal relative movement in directions 121a, 121b can cause each pair of adjacent wedge members to move in opposite directions 122a, 122b relative to one another, which may be lateral or transverse to the longitudinal axis 107. As shown in the FIG. 4 example, the intermediate wedge member 111e is diverted or transversely displaced relative to the wedge members 110b, 112d in direction 122a (e.g., away from the housing 104 and toward the pressure vessel 101), and the wedge members 110b, 112d are transversely displaced relative to the intermediate wedge member 111e in direction 122b (e.g., toward the housing 104 and away from the pressure vessel 101). This can force interface surfaces of the wedge lock assembly 103 against the housing 104 and the pressure vessel 101. For example, inner interface surfaces 116, 117 of the respective end and intermediate wedge members 110b, 112d can be forced against an interface surface of the housing 104, and an outer interface surface 118 of the intermediate wedge member 111e can be forced against an interface surface of the pressure vessel 101. The result is engagement and application of a clamping force by the wedge lock assembly 103 to the housing 104 and the pressure vessel 101. Moving adjacent wedge members longitudinally away from one another in directions 123a, 123b can facilitate relative displacement of the adjacent wedge members in directions 124a, 124b (opposite directions 122a, 122b) to disengage the wedge lock assembly 103 from the pressure vessel 101 and/or the housing 104.

Figure 5:
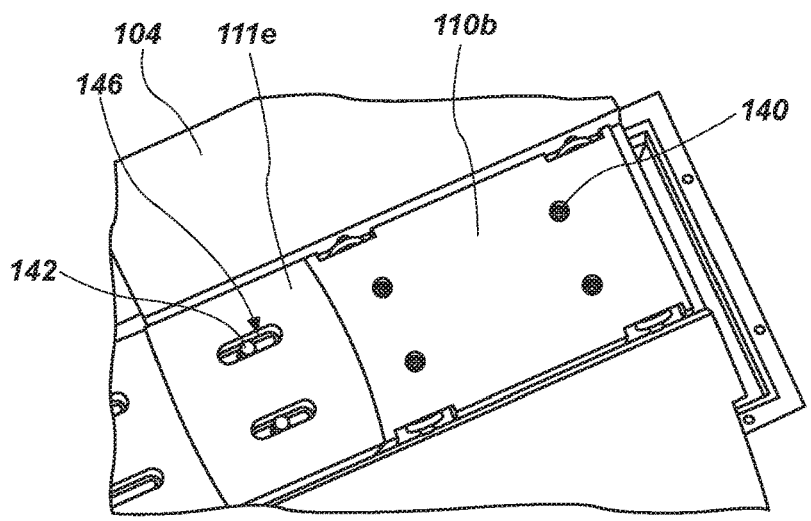
FIG. 5 is a detail top view of an end wedge member of the wedge lock assembly of FIG. 3.
Figure 6:
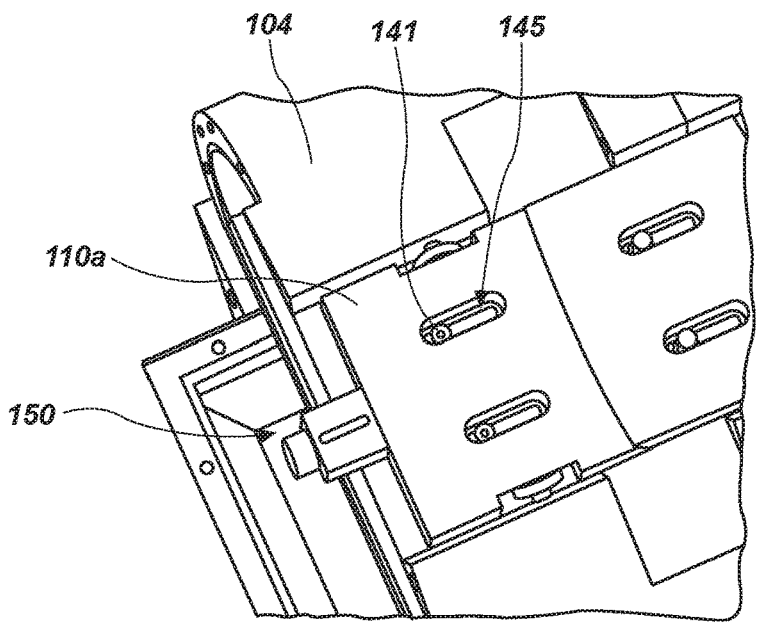
FIG. 6 is a detail top view of opposite end wedge member of the wedge lock assembly of FIG. 3.

In one aspect, the wedge members can be secured to the housing 104, which can prevent rotation of the wedge members about the screw 120 as the screw 120 is rotated. For example, as shown in FIG. 5, the end wedge member 110b can be fixed to the housing 104, such as by a fastener 140 (e.g., a bolt). Other wedge members can be movable relative to the housing 104. For example, as shown in FIG. 6, the end wedge member 110a can be coupled to the housing 104 such that it is movable relative to the housing 104. This can be accomplished by utilizing a fastener 141 (e.g., a shoulder bolt) extending through a slotted opening 145 in the end wedge member 110a. The slotted opening 145 can be configured to provide clearance sufficient to accommodate tightening of the wedge lock assembly 103 by the screw 120 to exert a clamping force on the housing 104 and the pressure vessel 101. In one aspect, the end wedge member 110a can be constrained to move only in a direction parallel to the longitudinal axis 107, and can therefore remain out of contact with the pressure vessel 101 when in a clamped configuration. The intermediate wedge members 112a-d can be movable relative to the housing 104 similar to that of the end wedge member 110a, and can therefore remain out of contact with the pressure vessel 101 when in a clamped configuration.

Figure 7:
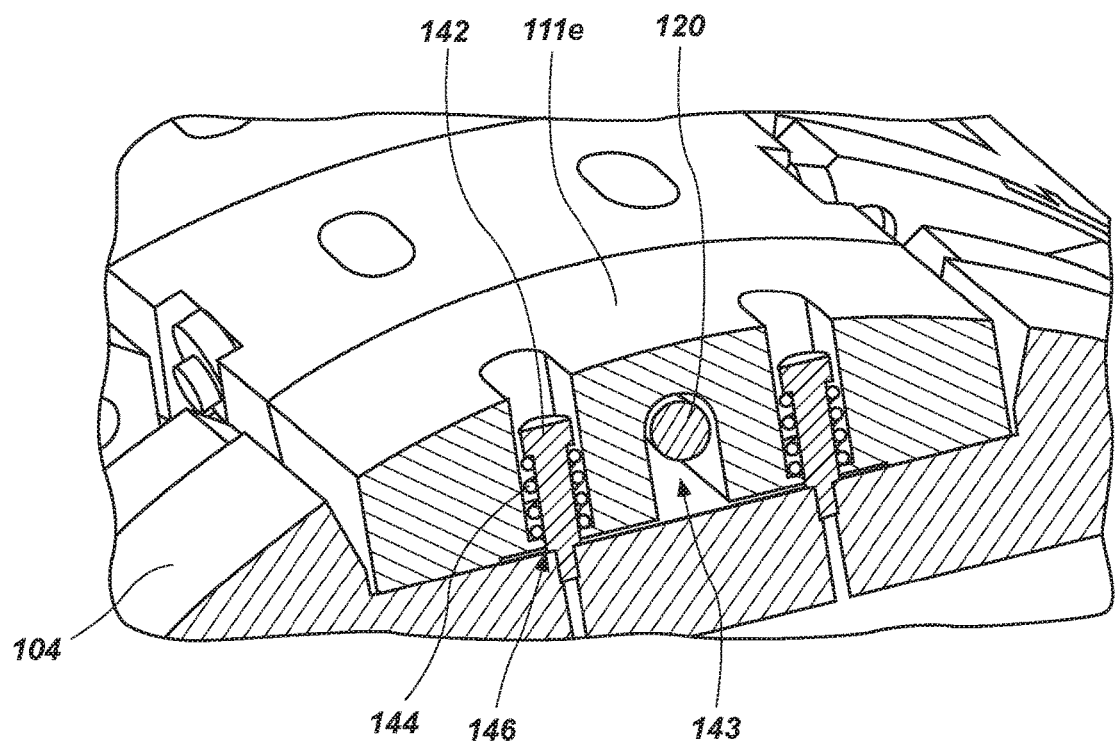
FIG. 7 is a detail cross-sectional view of a wedge member of the wedge lock assembly of FIG. 3.

The intermediate wedge members 111a-e can also be coupled to the housing 104 such that they are movable relative to the housing 104 in a direction parallel to the longitudinal axis 107. However, the intermediate wedge members 111a-e can also be movable laterally outward or away from the housing 104. For example, the intermediate wedge member 111e in FIG. 5 (shown in cross-section in FIG. 7) can be coupled to the housing 104 such that it is movable laterally outward or away from the housing 104. This can be accomplished by utilizing a fastener 142 (e.g., a shoulder bolt) extending through a slotted opening 146 in the intermediate wedge member 111e. An opening 143 in the intermediate wedge member 111e for the screw 120 can be configured to facilitate the lateral outward movement of the intermediate wedge member 111e away from the housing 104. In one aspect, the intermediate wedge members 111a-e can be biased inward toward the housing 104 and away from the pressure vessel 101. For example, the intermediate wedge member 111e can be biased inward toward the housing 104 by a biasing spring 144 that acts on a head of the fastener 142 and the intermediate wedge member 111e. Such biasing of the intermediate wedge members 111a-e toward the housing can cause these wedge members to be or remain disengaged from the pressure vessel when the screw 120 is loosened to allow the end wedge members 110a, 110b to be moved away from one another.

The internal component 105 can be any suitable component that may be disposed within the pressure vessel 101. For example, the internal component 105 can comprise one or more electronic components. It is common for electronic components to generate heat during operation. The internal component 105 can therefore comprise one or more heat generating components. In some embodiments, the internal component 105 can comprise a power branch unit (PBU) or power distribution unit (PDU) for an underwater line (e.g., a power or communication line), which can generate a significant amount of heat. Accordingly, the internal assembly 102 can be configured to provide a thermal cooling path to conduct heat away from the internal electronic component 105, which is in an enclosed chamber formed by the pressure vessel 101. In one aspect, the contact pads 106 and/or the wedge lock assembly 103 can form part of the thermal cooling path. In some embodiments, the contact pads 106 and/or the wedge lock assembly 103 can include a thermally conductive material. Any suitable thermally conductive material can be utilized. In some embodiments, the thermally conductive material can be configured as an elastomeric "gap pad" that can compress against the pressure vessel 101 and facilitate heat transfer by eliminating air gaps at the interface.

In some embodiments, the system 100 can be utilized in a deep-water environment. In such cases, the pressure vessel 101 may be deformed by large pressure differences across the inside and outside of the pressure vessel 101. Dimensional changes and deformation of the pressure vessel 101 can negatively impact the thermal interfaces between the internal assembly 102 and the pressure vessel 101 and therefore be detrimental to heat transfer, which can be problematic for the internal electronic component 105. In addition, deformation of the pressure vessel 101 can potentially impose large loads on the internal assembly 102. Thus, in one aspect, the system 100 can be configured to maintain a suitable thermal contact area and prevent large, potentially destructive loads on the internal assembly 102 by accommodating the dimensional changes of the outer pressure vessel 101 structure as external pressure increases.

Figure 8:
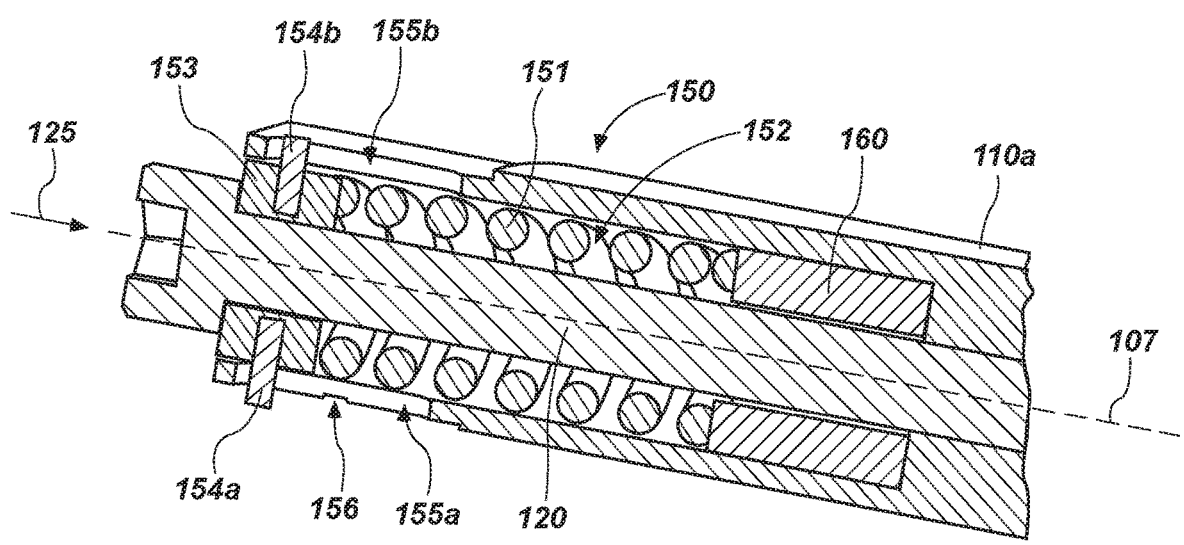
FIG. 8 is a detail cross-sectional view of a variable gap compensation mechanism of the wedge lock assembly of FIG. 3.

Accordingly, the wedge lock assembly 103 can include a variable gap compensation mechanism 150. A detailed cross-sectional view of the variable gap compensation mechanism 150 is shown in FIG. 8. FIGS. 1-7 are further referenced to describe various aspects of the variable gap compensation mechanism 150. The variable gap compensation mechanism 150 can be configured to accommodate relative lateral or transverse movement of the wedge members relative to the axis 107, which may be caused by deformation of the pressure vessel 101 due to increased external pressure, and maintain the clamping force on the housing 104 and the pressure vessel 101. For example, the variable gap compensation mechanism 150 can be configured to accommodate and allow relative inward transverse movement or displacement of the wedge members in directions 124a, 124b (FIG. 4). Such relative inward transverse movement of the wedge members in directions 124a, 124b will cause the wedge members to move outward or away from one another longitudinally in directions 123a, 123b. This relative inward transverse movement of the wedge members in directions 124a, 124b and outward longitudinal movement of the wedge members in directions 123a, 123b is provided for and accommodated by the variable gap compensation mechanism 150, which therefore allows for a shrinking gap 109 (FIG. 4) in the space between the housing 104 and the pressure vessel 101 occupied by the wedge lock assembly 103. On the other hand, the variable gap compensation mechanism 150 can provide relative inward longitudinal movement of the wedge members in directions 121a, 121b to cause relative outward transverse movement or displacement of the wedge members in directions 122a, 122b to accommodate an expanding gap 109 in the space between the housing 104 and the pressure vessel 101 occupied by the wedge lock assembly 103. Such a condition may exist when the external pressure on the pressure vessel 101 decreases. The variable gap compensation mechanism 150 can therefore accommodate a variable shrinking or expanding gap 109 between the housing 104 and the pressure vessel 101 and maintain a suitable clamping or locking force by the wedge lock assembly 103 on the housing 104 and the pressure vessel 101.

In one aspect, the variable gap compensation mechanism 150 can be configured to exert biasing force on the wedge members and maintain clamping force exerted on the housing 104 and the pressure vessel 101 by the wedge lock assembly 103 within a predetermined range as the distance or gap 109 between the housing 104 and the pressure vessel 101 varies. For example, as shown in FIG. 8, the variable gap compensation mechanism 150 can include a spring 151 associated with the screw 120, which can be configured to exert biasing force on the wedge members. In this case, the spring 151 is configured to exert a biasing force on the end wedge member 110a, which in turn exerts force on the other wedge members. As the pressure vessel 101 experiences increased external pressure, adjacent wedge members can be caused to move transversely inward relative to one another in directions 124a, 124b, which causes the wedge members to move outward or away from one another longitudinally in directions 123a, 123b, thereby compressing the spring 151 and increasing a biasing force provided by the spring against the wedge members. Thus, the spring 151 can provide a suitable clamping force range on the housing 104 and the pressure vessel 101 over a given external pressure range and temperature range. In other words, the spring 151 can be configured to provide compliance of the wedge lock assembly 103 to input loading from the pressure vessel 101 and therefore accommodate the dimensional changes of the pressure vessel 101 caused by external pressure. The compliance of the wedge lock assembly 103 can also maintain acceptable loading on the housing 104 with no risk of overloading the housing 104 or other internal components during normal operating conditions (e.g., external pressure and temperature within typical ranges).

In some embodiments, the pressure vessel 101 may not deform or deflect uniformly with respect to the housing 104. In other words, the gap 109 (FIG. 4) may not be uniform along the longitudinal axis 107. This may be due to the design or configuration of the pressure vessel 101. For example, a cylindrical pressure vessel may deflect more in the middle and less toward the ends, resulting in an "hourglass" shape under pressure. The wedge lock assembly 103 with multiple wedge members 111a-e in contact with the pressure vessel 101 and movable independently of one another can accommodate different radial displacements or gap distances 109 along the longitudinal axis 107.

In one aspect, the spring 151 and the wedge members can be configured such that a biasing force provided by the spring 151 fluctuates within a desired spring compression load range while maintaining a clamping force provided by the wedge lock assembly 103 on the housing 104 and the pressure vessel 101 within a suitable range. In another aspect, the biasing force provided by the spring 151 can fluctuate within a desired spring compression load range while maintaining a suitable contact pressure to the contact pads 106, which can ensure adequate heat transfer to the pressure vessel 101. Variables such as spring rate, maximum spring compression distance, and wedge angle (see 119 in FIG. 4) can be considered when designing the spring 151 and the wedge members to provide sufficient clamping force and spring travel for a gap variation in a given application. In addition, the wedge angle 119 is a function of the friction between adjacent interfacing wedge surfaces and the total number of wedges. The wedge angle 119 can be selected to achieve a desired spring force to clamping force ratio. For example, a larger wedge angle 119 will provide a higher clamping force for a given spring force. The spring 151 can be configured to have an adequate deflection or compression range to ensure that the spring 151 does not fully compress and become "solid" during normal operation.

The spring 151 can be disposed at least partially within an opening 152 in the end wedge member 110a, which can house and shield the spring 151. The spring 151 can be any suitable type of spring, such as a compression spring (e.g. a coil spring, a die spring, etc.), a Belleville washer, etc.

The variable gap compensation mechanism 150 can also include a spring retainer 153 associated with the screw 120 and the spring 151. The spring retainer 153 can be of any suitable configuration, such as a traveling nut. In one aspect, the spring retainer 153 can be associated with the screw 120 and the spring 151 such that rotation of the screw 120 moves the spring retainer 153 to preload the spring 151 and apply clamping or locking force to the housing 104 and the pressure vessel 101. For example, the spring 151 can be between the spring retainer 153 and the end wedge member 110a. The spring retainer 153 can be disposed at least partially in the opening 152 and can be prevented from rotating with the screw 120 by pins 154a, 154b coupled to the spring retainer 153 and extending at least partially into respective openings or slots 155a, 155b in the end wedge member 110a. The screw 120 is rotated to move the spring retainer 153 in direction 125 toward the wedge member 110a. The spring retainer 153 can compress the spring 151 upon generation of a clamping or locking force between the housing 104 and the pressure vessel 101, which can preload the spring 151.

The variable gap compensation mechanism 150 can include a spring preload position indicator 156 that can be used for inspection to verify that the spring 151 has been adequately preloaded. For example, the spring retainer 153 can be driven in direction 125 by rotating the screw 120 until the pin 154a, which can be visible through the slot 155a, is adjacent the spring preload position indicator 156. This can indicate that the spring retainer 153 has compressed the spring 151 sufficient to adequately preload the spring 151 and maintain adequate clamping force on the housing 104 and the pressure vessel 101 throughout a range of deflection or deformation of the pressure vessel 101 due to external pressure variations.

In some embodiments, the variable gap compensation mechanism 150 can include a resilient bumper 160 disposed between the spring 151 and the end wedge member 110a to accommodate a rapid transient reduction in the distance 109 between the pressure vessel 101 and the housing 104 that causes full compression of the spring 151, which may occur during a shock event such as an underwater explosion. The resilient bumper 160 can soften the impact load on the screw 120 and therefore prevent or minimize damage to the wedge lock assembly 103 during such events. The resilient bumper 160 can be disposed at least partially within the opening 152 in the end wedge member 110a, which can house and shield the resilient bumper 160. In one aspect, the resilient bumper 160 can be arranged in series with the spring 151, such as about the screw 120. The resilient bumper 160 can be any suitable type of material or configuration, such as an elastomer, a coil spring with a suitably stiff spring rate, etc.

In one aspect, the wedge lock assembly 103 can include one or more rollers or wheels 170 (i.e., configured to provide rolling surface contact) and/or one or more sliders (i.e., configured to provide sliding surface contact) coupled to one or more of the wedge members to facilitate positioning the wedge lock assembly 103 (and housing 104 in some embodiments) relative to the pressure vessel 101. For example, the end wedge members 110a, 110b, and the intermediate wedge members 112a-d that are constrained and prevented from moving outward or away from the housing 103 can include rollers 170 and/or sliders that are configured to extend above or beyond outer surfaces of the wedge members 110a-b, 111a-e, 112a-d when all the wedge members are positioned proximate or against the housing 104. Thus, when the screw 120 is loosened and the wedge members 111a-e are moved toward the housing 104 (e.g., by the biasing springs 144), the rollers 170 and/or sliders can be exposed to engage and interface with an interior surface of the pressure vessel 101 to facilitate rolling or sliding the inner assembly 102 into or out of the pressure vessel 101.

Figure 9:
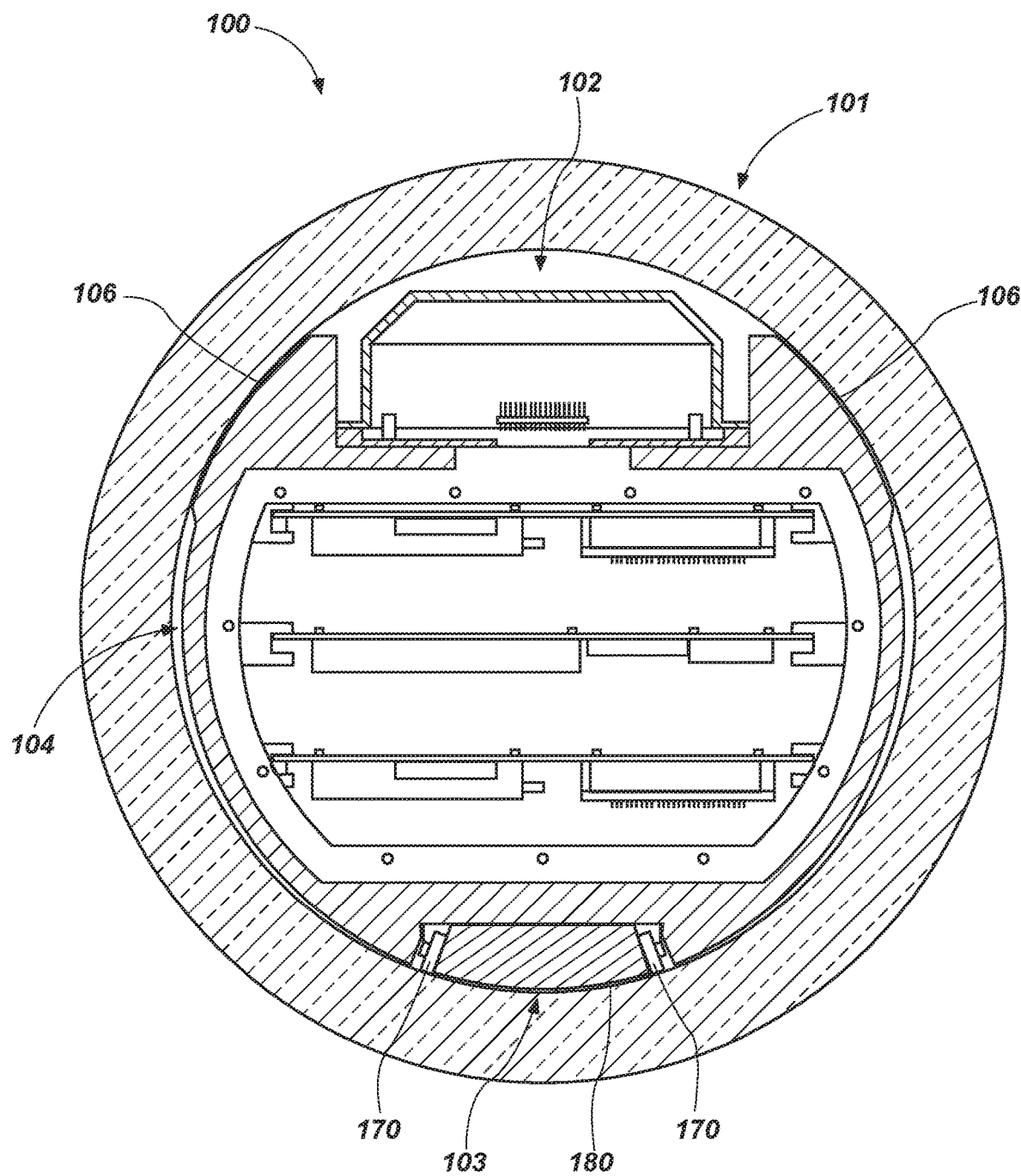
FIG. 9 is an end cross-sectional view of the deep-water submersible system of FIG. 1 in an unclamped configuration.
Figure 10:
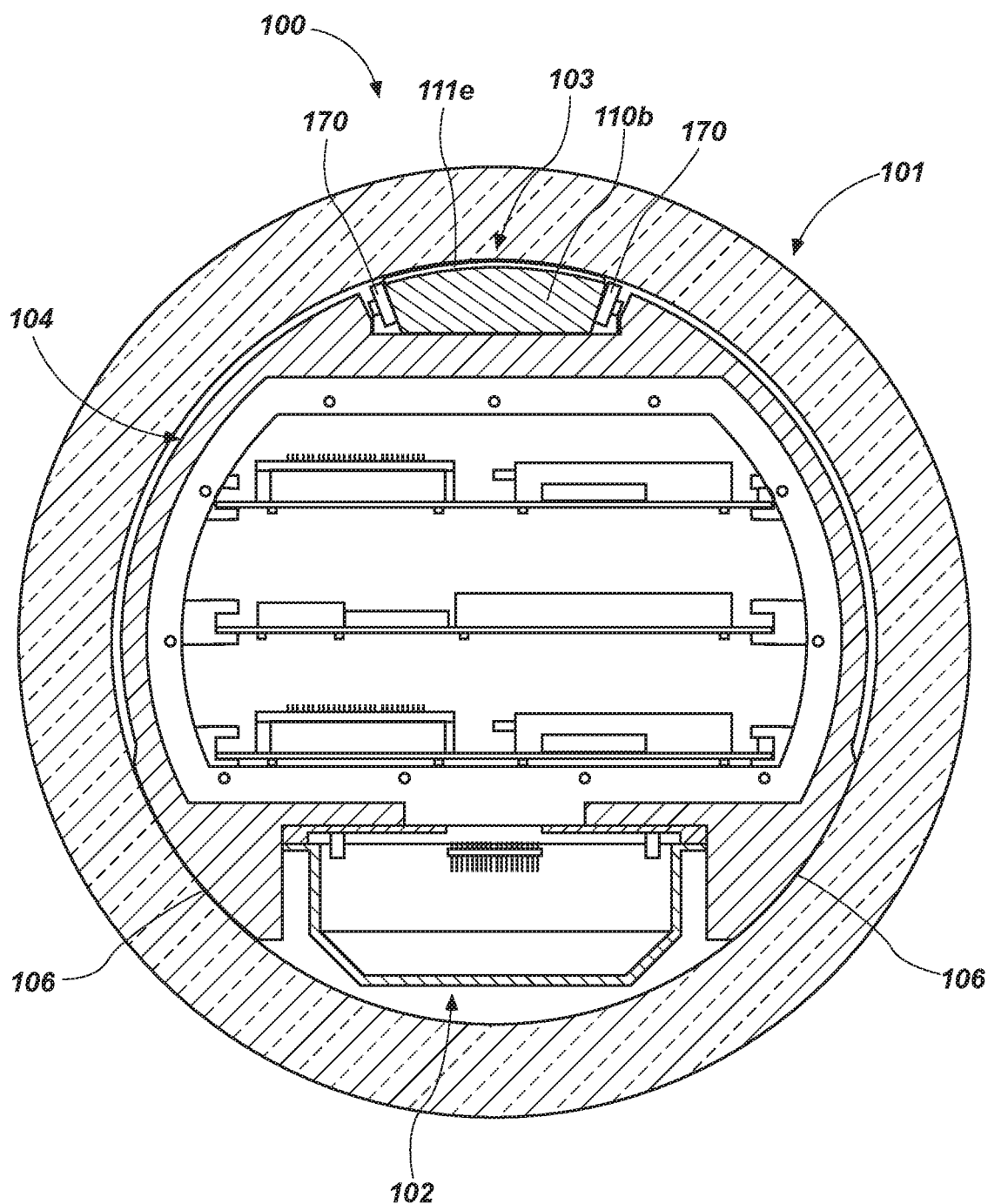
FIG. 10 is an end cross-sectional view of the deep-water submersible system of FIG. 1 in a clamped configuration.

This is demonstrated in FIGS. 9 and 10, which are discussed with further reference to FIGS. 1-8. FIG. 9 shows an end cross-sectional view of the system 100 with the pressure vessel 101 and the inner assembly 102 in an unclamped relationship. In this case, the inner assembly 102 is oriented to position the wedge lock assembly 103 on the bottom such that the rollers 170 are in contact with an inner surface 180 of the pressure vessel 101. In this configuration, the housing 104 (i.e., the contact pads 106) has clearance with the pressure vessel 101. In addition, the biasing springs 144 (FIG. 7) keep the wedge members 111a-e clear of the pressure vessel 101. The rollers 170 and the biasing springs 144 can therefore facilitate rolling the inner assembly 102 into or out of the pressure vessel 101. As the wedge lock assembly 103 is transversely expanded to clamp the inner assembly 102 and the pressure vessel 101 to one another (e.g., by rotating the screw 120), the wedge members 111a-e can be forced into contact with the pressure vessel 101 against the biasing springs 144, thus disengaging the rollers 170 from the pressure vessel 101 and engaging contact pads 106 with the pressure vessel 101, as shown in FIG. 10. Transverse expansion of the wedge lock assembly 103 can force the housing 104 against a back wall (not shown) of the pressure vessel 101, which can ensure that there is no end play between the inner assembly 102 and the pressure vessel 101. The wedge lock assembly 103 can therefore facilitate simple and repeatable assembly/disassembly of the system 100.

Reference was made to the examples illustrated in the drawings and specific language was used herein to describe the same. It will nevertheless be understood that no limitation of the scope of the technology is thereby intended. Alterations and further modifications of the features illustrated herein and additional applications of the examples as illustrated herein are to be considered within the scope of the description.

Although the disclosure may not expressly disclose that some embodiments or features described herein may be combined with other embodiments or features described herein, this disclosure should be read to describe any such combinations that would be practicable by one of ordinary skill in the art. The user of "or" in this disclosure should be understood to mean non-exclusive or, i.e., "and/or," unless otherwise indicated herein.

Furthermore, the described features, structures, or characteristics may be combined in any suitable manner in one or more examples. In the preceding description, numerous specific details were provided, such as examples of various configurations to provide a thorough understanding of examples of the described technology. It will be recognized, however, that the technology may be practiced without one or more of the specific details, or with other methods, components, devices, etc. In other instances, well-known structures or operations are not shown or described in detail to avoid obscuring aspects of the technology.

Although the subject matter has been described in language specific to structural features and/or operations, it is to be understood that the subject matter defined in the appended claims is not necessarily limited to the specific features and operations described above. Rather, the specific features and acts described above are disclosed as example forms of implementing the claims. Numerous modifications and alternative arrangements may be devised without departing from the spirit and scope of the described technology.

What is claimed is:

1. A wedge lock assembly, comprising:
a plurality of wedge members oriented in a side-by-side arrangement along a longitudinal axis, the plurality of wedge members including end wedge members at opposite ends of the side-by-side arrangement, and one or more intermediate wedge members between the end wedge members in the side-by-side arrangement;
a displacement device comprising a screw extending along and rotatable about the longitudinal axis and connecting the end wedge members, the displacement device actuatable in one direction to move the end wedge members toward one another to displace adjacent wedge members relative to one another in a direction transverse to the longitudinal axis to engage and apply a clamping force to two components external to the wedge-lock assembly;
a variable gap compensation mechanism comprising a spring associated with the screw and operable to exert a biasing force on the plurality of wedge members to accommodate the relative transverse movement of the adjacent wedge members and maintain the clamping force on the two components by the plurality of wedge members within a predetermined range as a distance between the two components varies; and
a retainer associated with the screw and the spring, such that actuation of the screw moves the retainer relative to the screw to preload the spring and apply the clamping force to the two components, the retainer being prevented from rotating with the screw by a pin coupled to the retainer, the pin extending at least partially into a slot, the slot located within one of the end wedge members, and the retainer further comprising a spring preload position indicator proximate the slot, the pin being visible through the slot relative to the spring preload position indicator to indicate whether the spring is preloaded sufficient to apply the clamping force on the two components.

2. The wedge lock assembly of claim 1, wherein the spring comprises a compression spring, a Belleville washer, or a combination thereof.

3. The wedge lock assembly of claim 1, wherein the spring is positioned between the spring retainer and one of the end wedge members.

4. The wedge lock assembly of claim 1, further comprising a resilient bumper disposed between the spring and one of the end wedge members to accommodate a rapid transient reduction in the distance between the two components sufficient to cause full compression of the spring.

5. The wedge lock assembly of claim 1, further comprising at least one of a roller and a slider coupled to at least one of the wedge members to facilitate positioning the wedge lock assembly relative to at least one of the two components.

6. The wedge lock assembly of claim 1, wherein each end wedge member comprises a wedge surface, and each intermediate wedge member comprises wedge surfaces at opposite ends, such that the wedge surfaces of adjacent wedge members engage one another.

7. A deep-water submersible system, comprising:
a pressure vessel; and
an internal assembly comprising
a housing, and
a wedge lock assembly coupleable to the housing and operable to interface with the pressure vessel, the wedge lock assembly including
a plurality of wedge members oriented in a side-by-side arrangement along a longitudinal axis, the plurality of wedge members including end wedge members at opposite ends of the side-by-side arrangement, and one or more intermediate wedge members between the end wedge members in the side-by-side arrangement,
a displacement device comprising a screw extending along and rotatable about the longitudinal axis and connecting the end wedge members, the displacement device actuatable in one direction to move the end wedge members toward one another to displace adjacent wedge members relative to one another in a direction transverse to the longitudinal axis to engage and apply a clamping force to the housing and the pressure vessel, and
a variable gap compensation mechanism comprising a spring associated with the screw and operable to exert a biasing force on the plurality of wedge members to accommodate the relative transverse movement of the adjacent wedge members and maintain the clamping force on the housing and the pressure vessel within a predetermined range as a distance between the housing and the pressure vessel varies; and
a retainer associated with the screw and the spring, such that actuation of the screw moves the retainer relative to the screw to preload the spring and apply the clamping force to housing and the pressure vessel, the retainer being prevented from rotating with the screw by a pin coupled to the retainer, the pin extending at least partially into a slot, the slot located within one of the end wedge members, and the retainer further comprising a spring preload position indicator proximate the slot, the pin being visible through the slot relative to the spring preload position indicator to indicate whether the spring is preloaded sufficient to apply the clamping force on the two components.

8. The system of claim 7, wherein the spring comprises a compression spring, a Belleville washer, or a combination thereof.

9. The system of claim 7, wherein the spring is positioned between the spring retainer and one of the end wedge members.

10. The system of claim 7, further comprising a resilient bumper disposed between the spring and one of the end wedge members to accommodate a rapid transient reduction in the distance between the housing and the pressure vessel sufficient to cause full compression of the spring.

11. The system of claim 7, further comprising at least one of a roller and a slider coupled to at least one of the wedge members to facilitate positioning the wedge lock assembly relative to at least one of the housing and the pressure vessel.

12. The system of claim 7, wherein the housing comprises contact pads for interfacing with the pressure vessel.

13. The system of claim 12, further comprising further comprising a heat generating component supported by the housing, wherein the contact pads comprise a thermally conductive material.

14. The system of claim 13, wherein the thermally conductive material comprises an elastomer.

15. The system of claim 12, wherein the contact pads and the wedge lock assembly are equally circumferentially spaced from one another about the housing.

16. The system of claim 12, wherein the contact pads comprise two contact pads, and wherein the two contact pads and the wedge lock assembly are circumferentially spaced apart from one another about the housing, such that the contact pads and the wedge lock assembly provide a three-point contact of the internal assembly with the pressure vessel.

17. The system of claim 16, wherein the two contact pads and the wedge lock assembly are circumferentially spaced 120 degrees apart from one another about the housing.

18. A deep-water submersible system, comprising:
a pressure vessel; and
an internal assembly comprising
a housing, and
a wedge lock assembly coupleable to the housing, the wedge lock assembly including
a plurality of wedge members oriented in a side-by-side arrangement along a longitudinal axis, the plurality of wedge members including end wedge members at opposite ends of the side-by-side arrangement, and one or more intermediate wedge members between the end wedge members in the side-by-side arrangement,
a displacement device along the longitudinal axis and connecting the end wedge members, the displacement device actuatable in one direction to move the end wedge members toward one another to displace adjacent wedge members relative to one another in a direction transverse to the longitudinal axis to engage and apply a clamping force to the housing and the pressure vessel, and
at least one roller coupled to at least one of the wedge members to facilitate positioning the wedge lock assembly relative to at least one of the housing and the pressure vessel.

19. The system of claim 18, wherein the displacement device comprises a screw extending along and rotatable about the longitudinal axis.

20. The system of claim 18, further comprising a variable gap compensation mechanism operable to exert a biasing force on the plurality of wedge members to accommodate the relative transverse movement of the adjacent wedge members and maintain the clamping force on the housing and the pressure vessel within a predetermined range as a distance between the housing and the pressure vessel varies.

21. The system of claim 20, wherein the variable gap compensation mechanism comprises a spring associated with the screw and configured to exert the biasing force on the wedge members.

22. The system of claim 21, wherein the variable gap compensation mechanism comprises a spring retainer associated with the screw and the spring, such that rotation of the screw moves the spring retainer to preload the spring and apply the clamping force to the housing and the pressure vessel.

23. The system of claim 21, wherein the spring comprises a compression spring, a Belleville washer, or a combination thereof.

24. The system of claim 21, wherein the spring is positioned between the spring retainer and one of the end wedge members.

25. The system of claim 21, further comprising a resilient bumper disposed between the spring and one of the end wedge members to accommodate a rapid transient reduction in the distance between the housing and the pressure vessel sufficient to cause full compression of the spring.

26. The system of claim 18, wherein the housing comprises contact pads for interfacing with the pressure vessel.

27. The system of claim 26, further comprising further comprising a heat generating component supported by the housing, wherein the contact pads comprise a thermally conductive material.

28. The system of claim 27, wherein the thermally conductive material comprises an elastomer.

29. The system of claim 26, wherein the contact pads and the wedge lock assembly are equally circumferentially spaced from one another about the housing.

30. The system of claim 26, wherein the contact pads comprise two contact pads, and wherein the two contact pads and the wedge lock assembly are circumferentially spaced apart from one another about the housing, such that the contact pads and the wedge lock assembly provide a three-point contact of the internal assembly with the pressure vessel.

31. The system of claim 30, wherein the two contact pads and the wedge lock assembly are circumferentially spaced 120 degrees apart from one another about the housing.

* * * * *